(12) United States Patent  
Abe (10) Patent No.: US 7,346,882 B2
(45) Date of Patent: Mar. 18, 2008

(54) PATTERN FORMING METHOD, MASK MANUFACTURING METHOD, AND LSI MANUFACTURING METHOD (75) Inventor: Takayuki Abe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 250 days.

(21) Appl. No.: 10/207,167

(22) Filed: Jul. 30, 2002

(65) Prior Publication Data
US 2003/0026472 A1 Feb. 6, 2003

(30) Foreign Application Priority Data
Jul. 30, 2001 (JP) ............................. 2001-230312

(51) Int. Cl.
G06F 17/50 (2006.01)

(52) U.S. Cl. .......................................... 716/19; 716/21

(58) Field of Classification Search .................... 716/1, 716/2, 19–21; 430/5, 30, 22
See application file for complete search history.

(56) References Cited

U.S. PATENT DOCUMENTS

| 5,451,487 A |   | 9/1995 | Abe et al. |
| 5,553,274 A | * | 9/1996 | Liebmann ..................... 716/21 |
| 5,801,954 A | * | 9/1998 | Le et al. ...................... 716/21 |
| 5,863,682 A |   | 1/1999 | Abe et al. |
| 5,965,308 A | * | 10/1999 | Ozawa ........................ 430/30 |
| 6,560,766 B2 | * | 5/2003 | Pierrat et al. ................. 716/19 |
| 6,703,169 B2 | * | 3/2004 | Fuller et al. .................... 430/5 |

FOREIGN PATENT DOCUMENTS

| JP | 56-42234 | 4/1981 |
| JP | 60-144743 | 7/1985 |
| JP | 3-121456 | 5/1991 |
| JP | 6-138643 | 5/1994 |
| JP | 7-43881 | 2/1995 |
| JP | 9-199391 | 7/1997 |
| JP | 11-26360 | 1/1999 |
| JP | 11-509006 | 8/1999 |
| JP | 2000-292906 | 10/2000 |
| JP | 2001-230203 | 8/2001 |
| KR | 1999-008257 | 1/1999 |
| KR | 2001-0069089 | 7/2001 |

OTHER PUBLICATIONS

T. Abe, et al., J. Vac. Sci. Technol. B, vol. 9, No. 6, pp. 3059-3062, "The Representative Figure Method for the Proximity Effect Correction [III]," Nov./Dec. 1991.

* cited by examiner

Primary Examiner—Jack Chiang
Assistant Examiner—Binh Tat
(74) Attorney, Agent, or Firm—Oblon, Spivak, McClelland, Maier & Neustadt, P.C.

(57) ABSTRACT

A pattern forming method includes the steps of checking a wide range size change characteristic for each device in a case of using a device group used for forming a pattern; dividing a design pattern size into a smaller area than a standard distance to which a predetermined size change is caused, when the pattern is formed on a sample by using the device group; acquiring correction information of the size of the pattern of each the small area by using the size change characteristic; and forming a desired pattern based on the acquired correction information.

8 Claims, 7 Drawing Sheets

Size of small area is assumed to be LXL, P to S nm in figure is assumed to be size correction amount calculated for each small area. Correction amount existed at position (x, y) in figure is calculated as:

$$T(x, y) = t \times s \times P + (1-t) \times Q + (1-s) \times R + (1-s) \times (1-t) \times S$$

Where,
$t = (x - L/2)/L$
$s = (y - L/2)/L$

| 5 | 5 | 4 | 2 | 1 |
|---|---|---|---|---|
| 6 | 6 | 5 | 4 | 2 |
| 5 | 5 | 4 | 2 | 1 |
| 4 | 4 | 2 | 1 | 0 |
| 2 | 2 | 1 | 0 | 0 |

Mask

Unit of numeral is nm

FIG. 8

| 1 | 2 | 2 | 1 | 0 |
|---|---|---|---|---|
| 2 | 4 | 3 | 2 | 1 |
| 3 | 5 | 4 | 2 | 1 |
| 2 | 3 | 2 | 1 | 1 |
| 1 | 2 | 2 | 1 | 0 |

Mask

Unit of numeral is nm

FIG. 9

| 6 | 7 | 6 | 3 | 1 |
|---|---|---|---|---|
| 8 | 10 | 8 | 6 | 3 |
| 8 | 10 | 8 | 4 | 2 |
| 6 | 7 | 4 | 2 | 1 |
| 3 | 4 | 3 | 1 | 0 |

Mask

Unit of numeral is nm

FIG. 10A

Pattern drawing by mask drawing apparatus

FIG. 10B resist development

FIG. 10C

COG etching

FIG. 10D

Remove resist

Pattern transfer by stepper or scanner using mask

FIG. 11B

Development

FIG. 11C

Etching of insulation film

Remove resist

FIG. 11E

Pattern transfer by stepper or scanner using mask

FIG. 12B

Al deposition

FIG. 11F

Development

FIG. 12C

Etching

FIG. 12D

CMP processing

FIG. 11G

Remove resist

FIG. 12E

Size of small area is assumed to be L×L, P to S nm in figure is assumed to be size correction amount calculated for each small area. Correction amount existed at position (x, y) in figure is calculated as:

$T(x, y) = t \times s \times P + (1-t) \times Q + (1-s) \times R + (1-s) \times (1-t) \times S$ Where,
$t = (x - L/2)/L$
$s = (y - L/2)/L$

FIG. 13

PATTERN FORMING METHOD, MASK MANUFACTURING METHOD, AND LSI MANUFACTURING METHOD

CROSS-REFERENCE TO RELATED APPLICATIONS

This application is based upon and claims the benefit of priority from the prior Japanese Patent Application No. 2001-230312, filed Jul. 30, 2001, the entire contents of which are incorporated herein by reference.

BACKGROUND OF THE PRESENT INVENTION

1. Field of the Invention

The present invention relates to a pattern forming method to form a desired pattern on a substrate to be processed. The present invention relates to a mask manufacturing method to manufacture a mask based on a corrected pattern, especially. In addition, the present invention relates to an LSI manufacturing method to form an LSI pattern on a wafer based on a mask to which a pattern is corrected.

2. Description of the Related Art

In manufacture of an LSI, first, a mask having an opening or a light shielding pattern which corresponds to an LSI pattern using a mask drawing device etc. is manufactured. Next, the pattern on the mask is transferred to a resist on the wafer using an optical stepper or a scanner. Thereafter, a pattern of one layer is manufactured through various processes such as development and etching. The LSI is manufactured repeating such a pattern manufacturing process. In manufacture of the mask, the mask is manufactured through some processes of exposure of the resist on the mask with the mask drawing device, development of the resist and etching of a COG (Cr On Glass) etc.

The electron beam exposure device is chiefly used for drawing of the mask now, but the light might be used. The light is used in general in the device which transfers the pattern on the mask to the wafer, and the technology which uses an electronic line and X rays is also studied. Even in the pattern formation for only one layer of the LSI, various processes as mentioned above are required in any one of techniques.

In the LSI pattern or the pattern on the mask made through such processes, there are the following problems. This problem is a problem that "each pattern is almost uniformly finished (Locally, the difference with the design size is almost the same) at local observation, but the pattern size gradually changes if it is observed with in all internal of the chip formed in the entire mask or the wafer (The difference with the design size changes gradually in the chip)".

Figure 1:
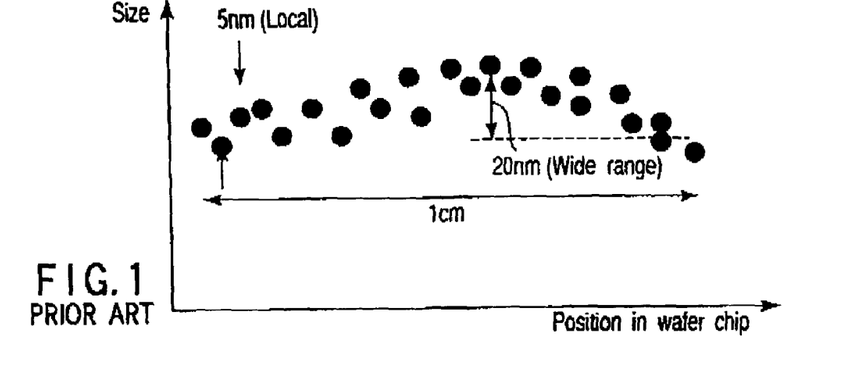
FIG. 1 is a figure which shows an example of the local size change and the wide range size change.
Figure 2A:
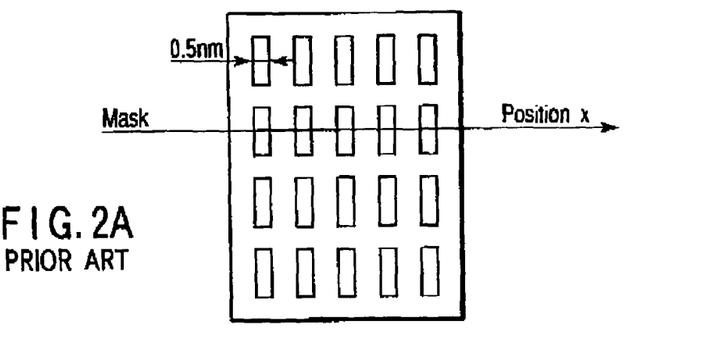
FIG. 2A to FIG. 2C are figures which show an example of the wide range size change which depends on each of the pattern and position.
Figure 2B:
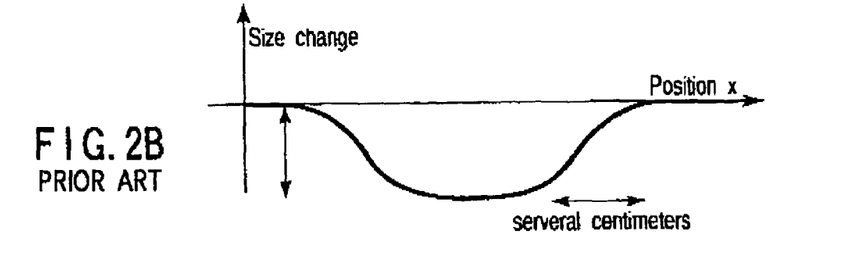
Figure 2C:
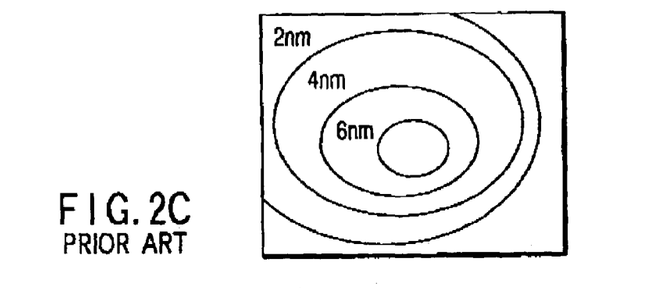

This appearance is shown in FIG. 1 schematically. The difference with the design size is small at the near position in the wafer chip (local). However, the difference with the design size is large at the point of far position in the chip (wide range). Here, the distribution of the error shown in FIG. 1 becomes the distribution of which the size error depending on the pattern and the size error depending on the position shown in FIG. 2A to FIG. 2C are added. FIG. 2A shows the line & space pattern. FIG. 2B shows the size change according to the pattern density. FIG. 2C shows the size change in two-dimensional plane position.

As a similar problem, there is an effect which is called a "Fogging" occurred when the mask drawing is performed with the electron beam exposure device. The fogging is the effect that the resist on the mask is exposed, thereafter the electron rebounds on the substrate, returns to the upper part of the stage of the device, reflects again thereby, and exposes the resist. The result brought about in this effect is similar to a wide range size changing as mentioned above, and the size changes gradually by the level of several cm. Therefore, the "Fogging" effect is one of wide range pattern size degradation factors on the mask.

The technology which adjusts the dose for each place is proposed as an action plan to the problem of this "Fogging" (fogging correction). In this method, the dose in each place to correct the size change is obtained with the computer etc. beforehand. The fogging effect is corrected (accurately controlled) by changing the dose based on it. Here, the dose is calculated as follows. The mask is divided into small areas, and the density of the pattern therein is calculated. Then, the calculated result is used. However, the technique of this fogging correction does not become an enough solution means to the problem of a wide range size change as follows.

First of all, this method is a method only to correct the fogging for the mask drawing with the electron beam exposure device. That is, it is a method of controlling the variation of an effective dose. Therefore, since the wide range size error which occurs on the process cannot be corrected, if this is done forcibly, the accuracy of the proximity effect correction etc. is degraded.

Therefore, it is insufficient to apply this method as it is when the LSI pattern is formed on the wafer, and the error caused by the etching when the reticle is made is corrected.

The second problem includes a problem on accuracy and the calculation time. There are other size degradation factors called as a proximity effect besides the fogging effect in the electron beam exposure device. This is a comparatively local size degradation factor to exert the influence on the area of about 30 μm. Since the size error occurred thereat is about 100 nm, and it is farther larger than the above-mentioned wide range size change. When this proximity effect is corrected, the method of changing the dose for every place is used.

In a word, both the fogging correction and the proximity effect correction adopt a method of changing the dose of each place to perform the correction. Therefore, to perform the correction processing accurately to all errors, it is necessary to calculate the optimal dose by considering both of them at the same time. To execute the method, it is necessary to calculate the optimal dose for each area (for instance, 1 μm×1 μm), which is farther smaller than the range where the proximity effect correction exerts. Additionally, it is necessary to consider all the influences of the pattern of the range that the influence of the fogging is exerted (for instance, several cm square).

The optimal dose is calculated by using a special circuit only in a case of the proximity effect correction now. The time required to calculate the optimal dose is about one hour. On the other hand, the distance to which the influence of the fogging is exerted is 30 times or more the distance to which the influence of the proximity effect is exerted. Since the amount of the calculation and the calculation time are proportional to the square of the area, about 1000 times the calculation time are required as assumed to be 30×30 times. That is, to calculate the fogging correction of the proximity effect correction at the same time, even if the special circuit can be used to correct the proximity effect now, the time becomes extending over about 1000 hours ,that is, about two months.

Therefore, the following methods have been adopted as a method of a conventional fogging correction. In the fogging correction, the dose is calculated only from the density of the pattern by ignoring the result of the proximity effect correction. The dose is calculated by performing real time processing in the drawing device by ignoring the influence of the fogging in the proximity effect correction. The dose for the fogging correction and the dose of the proximity effect correction are combined, a final dose is calculated, and the correction is performed. Since the interrelationship and the dependency between the proximity effect correction and the fogging correction will be ignored, when such a method is used. As a result, the error is caused. Therefore, the error occurs in the fogging correction, and in the effect on a wide range size change, the error is controlled to ¼ as far as possible. With this, the accuracy needed now and in the future cannot be satisfied.

Two or more processes and two or more manufacturing devices are needed in conventional manufacture of the mask and the LSI like this. It cannot be avoided to occur the wide range size change caused by this. And, it is difficult to accurately correct the wide range size change.

BRIEF SUMMARY OF THE INVENTION

An object of the present invention is to provide a pattern forming method of accurately correcting the wide range size change occurred at the manufacture of the mask and the LSI and to manufacture the mask and the LSI with high accurate.

A pattern forming method according to the first aspect of the present invention is characterized by comprising: checking a wide range size change characteristic for each device in a case of using a device group used for forming a pattern; dividing into smaller each area than a standard distance to which a predetermined size change is caused, when the pattern is formed on a sample by using the device group; acquiring correction information of the size of the pattern of each the small area by using the size change characteristic; and forming a desired pattern based on the acquired correction information. Here, it is preferable that checking the wide range size change includes checking two correlations of a correlation between a position and a size change in a chip on a wafer or two or more chips and a correlation between a pattern characteristic and a size change.

A manufacturing method of mask according to the second aspect of the present invention is characterized by comprising: checking a correlation of a position and a size change and a correlations of a pattern characteristic and a size change on the mask in a case of using a device group used for manufacturing the mask; correcting a design pattern size for smaller each area than a standard distance to which a predetermined size change is caused by using data of each correlation, when the mask is manufactured by using the device group; and forming a desired pattern on the mask based on the corrected design pattern size.

A manufacturing method of LSI according to the third aspect of the present invention is characterized by comprising: checking a correlation of a position and a size change and a correlation of a pattern characteristic and a size change in a chip on a wafer or a chip group in a case of using a device group used for a manufacturing process of the LSI; correcting a design pattern size for smaller each area than a standard distance to which a predetermined size change is caused by using data of the each correlation, when the LSI is manufactured by using the device group; forming a desired pattern on a mask based on the corrected design pattern size; and manufacturing the LSI by using the mask on which the desired pattern is formed.

A manufacturing method of mask according to the fourth aspect of the present invention is characterized by comprising: checking a correlation of a position and a size change and a correlations of a pattern characteristic and a size change on the mask in a case of using at least one of a plurality of devices used for manufacturing the mask; correcting a design pattern size for smaller each area than a standard distance to which a predetermined size change is caused by using data of the each correlation, when the mask is manufactured by using the each of the plurality of devices device; and forming a desired pattern based on the corrected design pattern size.

A manufacturing method of LSI according to the fifth aspect of the present invention is characterized by comprising: checking a first correlation of a position and a size change and a second correlation of a pattern characteristic and a size change in a chip on a wafer or a chip group in a case of using at least one of a plurality of devices used for a manufacturing process of the LSI; correcting a design pattern size for smaller each area than a standard distance to which a predetermined size change is caused by using data of the each of first and second correlations, when the LSI is manufactured by using the each of the plurality of devices; forming a desired pattern on a mask based on the corrected design pattern size; and manufacturing the LSI by using the mask on which the desired pattern is formed.

Here, the preferable forms of each above-mentioned aspect are as follows. The following forms may be applied solely or by combining appropriately.

(1) To check the characteristic of a wide range size change, the characteristic of a wide range size change is checked when the device group which uses for forming the pattern or other device groups whose characteristic is almost similar to the corresponding device group are used.

(2) As smaller area than the standard of the distance where the predetermined size change is caused, the size that the size change is in a permissible value or less is selected.

(3) The correction is performed for each of the small areas.

(4) The checking the correlations includes performing work of obtaining the first and the second correlations at substantially all processes, and obtaining the first and the second correlations in all processes from the first and second correlations in each process.

(5) The predetermined size change is a size change in a wide range in 1 cm order.

In each aspect, by correcting the size of the internal pattern for each smaller area than the standard of the size change, the above-mentioned wide range size change is corrected. As a result, a highly accurate correction by which the interaction with other corrections like the proximity effect correction etc. caused in the method of the fogging correction is avoided can be achieved. Moreover, a wide range error which occurs in each device and each process can be corrected mutually almost independently. In addition, the wide range size error which occurs in each device and each process can be separated to the contribution only according to the position and the contribution according to the pattern at the level which does not become the problem on practical use. And, it becomes possible to achieve the correction with high accuracy by correcting each of them almost independently.

As a concrete correction method, a wide range error which occurs in each device and each process and a wide range error which occurs through all processes are separated to the contribution at least only according to the position and the contribution according to the pattern. The pattern is locally transformed by using them. As a result, it becomes possible to correct the wide range size change.

DETAILED DESCRIPTION OF THE INVENTION

First of all, a basic principle of the present invention will be explained before the embodiments of the present invention will be explained.

It is considered that some causes where the wide range size change are occurred. The confirmed cause and the assumed cause will be listed and described as follows.

A) Process Until Mask Manufacture

1) When the electron is irradiated to the reticle in the electron beam exposure device, the electron reflected with the reticle is reflected at the upper part of the exposure device chamber and exposes the resist on the reticle again.

2) There is a pattern density dependency at etching. That is, the density of the chrome which begins to melt to the etching solvent changes depending on the pattern density on the resist and the density of chrome in this solvent changes the dissolution speed of chrome. When the mask is dry-etched, the loading effect is appeared. The etching speed changes depending on the pattern density. The size of chrome changes by the place as a result.

3) There is a possibility to occur a similar effect to 2) when developing the resist at development.

4) Since the reticle is not horizontally supported in the electron beam exposure device and is inclined slightly, the size changes by the place.

5) Even if the size on the reticle is correctly formed, when the reticle is set by the stepper, it is not supported to the wafer completely in parallel. Therefore, the size changes according to the place on the wafer.

B) Process Until the LSI is Manufactured on the Wafer by Using the Mask

1) When the pattern on the mask is transferred to the resist on the wafer by using the mask with the transfer devices such as the stepper or scanners, the assembly error in the transfer device etc. causes optical asymmetry. Therefore, the size change which depends on the place is caused.

2) The resist is developed after the process of B-1), similar to A-3), there is a possibility that the size changes depending on the pattern density etc.

3) The size depends on the pattern by the loading effect when the ground substrate is etched by using the resist as a mask. Moreover, according to the characteristic of the etching device, the size changes depending on the place.

4) The density dependency of the pattern appears in the process of chemical mechanical polishing (CMP) when the LSI is manufactured in the damacine process etc.

Various causes can be considered as a cause like the above-mentioned where the wide range size change is caused. A common feature to these is that where the range where the influence is exerted, that is, the unit of the area where the size change is caused becomes about cm or more. Oppositely, when inside the small area like several 10 to several 100 μm is locally observed, it may be consider that the size change is uniform in the area. Therefore, the correction may be performed for each area. This guarantees that "each smaller area than the standard of the size change distance (distance where a predetermined size change is caused) can be corrected" of the present invention method.

In addition, when a wide range change is corrected, the dose for each place does not change but the size for each figure is corrected. On the other hand, the proximity effect correction is corrected by changing the dose. Therefore, since the interaction is not cause between the correction of a the wide range size change of the present invention and the proximity effect correction, the interaction between the correction items like a conventional fogging correction does not exist.

It will be shown as follows that each above-mentioned cause can be corrected mutually almost independently. First of all, it can be considered that each factor and the event is almost independent mutually within the range of the first approximation. However, the influence of them are mutually appeared in the size, since both events influence the size change even if they are independent. If the influence of each other is estimated, the result is as follows. As one example, it is assumed that all the wide range size changes are occurred by (A) the size change by the place dependence caused by the irregular of the etching device (at mask manufacture or wafer manufacture process), and (B) the size change by the density dependence caused by the mask drawing device. In addition, the width of the change of a wide range size is assumed to be 20 nm.

The mutual influence becomes 0 if one of the influences of (A) and (B) is 0. Therefore, it can be considered that, the influence of (A) and the influence of (B) is almost the same in a case that the mutual influence between (A) and (B) become the maximum. Therefore, the width of the change by (A) and the width of the change by (B) are assumed to be both 10 nm. When this is indicated by ±, it becomes ±5 nm, respectively.

Here, the size change depend on the place caused by the etching of (A) is assumed the $p(x, y)$ in a certain place $(x, y)$. Where, $-5 \text{ nm} \leq p(x, y) \leq 5 \text{ nm}$. It is assumed that there are the line & space pattern of the irradiation part $\underline{a}$ μm, the non-irradiation part (m−a) μm, and the pitch m μm in the place as a design on the mask. In this case, the size of the irradiation part becomes {a+p(x, y)} from a and oppositely the size of non-irradiation part becomes {m−a−p(x, y)}, by the place dependence,. Therefore, the density p changes from a/m to {a+p(x, y)}/m.

The size change rate in this case becomes $$\{a+p(x, y)\}/a=1+p(x, y)/a \quad (1)$$

and a relative error becomes p(x, y)/a.

Here, the worst value of the relative error will be considered. The size of a is about the design size on the mask, and is the denominator. Therefore, the lower limit value of a may be chosen to check the worst value of the relative error. The design rule of the present latest development goods becomes 90 nm on the wafer, and becomes the four times, that is, 360 nm on mask. This value is adopted as the lower limit value of a, and it is assumed the model value. P(x, y) is the size error which is changed depending on the place. The above-mentioned ±5 nm may be adopted as the limit value. As a result, ±5 nm/360 nm can be obtained as the maximum value of the relative error. That is, a relative error is no more than ±1.4% at most.

Here, ±5 nm described as the width of the change of the size caused by change of the density is adopted. Since the maximum relative error of the density is 1.4%, it can be considered that the size error caused by this is about 1.4% of ±5 nm. This amount is only ±0.07 nm. This value can be ignored since it is sufficiently small.

Therefore, the error caused by the independent correction is only ±0.07 nm and can be ignored, even if the error according to each cause is independently corrected. That is, it is understood that each error may be independently corrected, When this discussion is generalized, it is understood that the mutual influence between two factors is about {(relative error by (A))×(relative error by (B))×design size}.

In the above-mentioned discussion, it is discussed that the mutual influence between each factor is discussed as a correlation of the position dependency between different devices and the pattern dependency (on the size), but the discussion is the same as the discussion in the same device. That is, the position dependency and the pattern dependency in a certain device may be mutually independently corrected. In addition, if the position dependency between two kinds of devices (for instance, mask drawing device and etching device) is discussed as well as the discussion as mentioned above, it is understood that the mutual influences are about {(the relative error of the size change of the position dependence with device 1)×(the relative error of the size change of the position dependence with device 2)×size}. That is, it can be considered that the pattern dependency between the different devices is also independent.

It is assumed that only second items contributed to the wide range size change in the above-mentioned discussion, but actually, by contributing other influences, It becomes width of the change of 20 nm as a total. In this case, the individual influence becomes smaller than 10 nm as described above. Therefore, the influence between factors becomes small further than the above-mentioned consideration. Therefore, the influence between factors may be ignored. It is no problem to correct the size independently in each factor conversely. "Error caused by the position dependence" which covers each factor and "Error caused by the density dependence" which covers each factor may be corrected independently.

The above-mentioned discussion is not limited to the mask manufacture though it is chiefly discussed on the mask. The discussion and the conclusion thereof are the same also in the LSI manufacture process. The position dependency of the size may be read as the position dependency in the chip on the wafer from the position dependency on the mask. Moreover, the density dependency may read as the pattern density dependency in the chip on the wafer from the pattern density dependency on the mask. However, since the size on the wafer becomes ¼ of sizes on the reticle at this time, the upper limit 0.15 nm of the error on the above-mentioned mask becomes 0.04 nm on the wafer. The error is only about 0.04% compared with 90 nm which is the design size on the wafer of an up-to-date development goods. That is, from the above-mentioned discussion, it is understood that it is no problem even when the error for the position dependence and the error for place dependence are independently corrected also in the LSI manufacture process.

It is possible to process it similarly when there are some correlations between the events, though each error factor is considered and discussed as an independent event mutually within the range of the first approximation. For instance, as explained with the embodiment described later, it is possible to add the position dependency into the characteristic of the pattern dependency and to process by combining it with a pure position dependency.

Figure 3A:
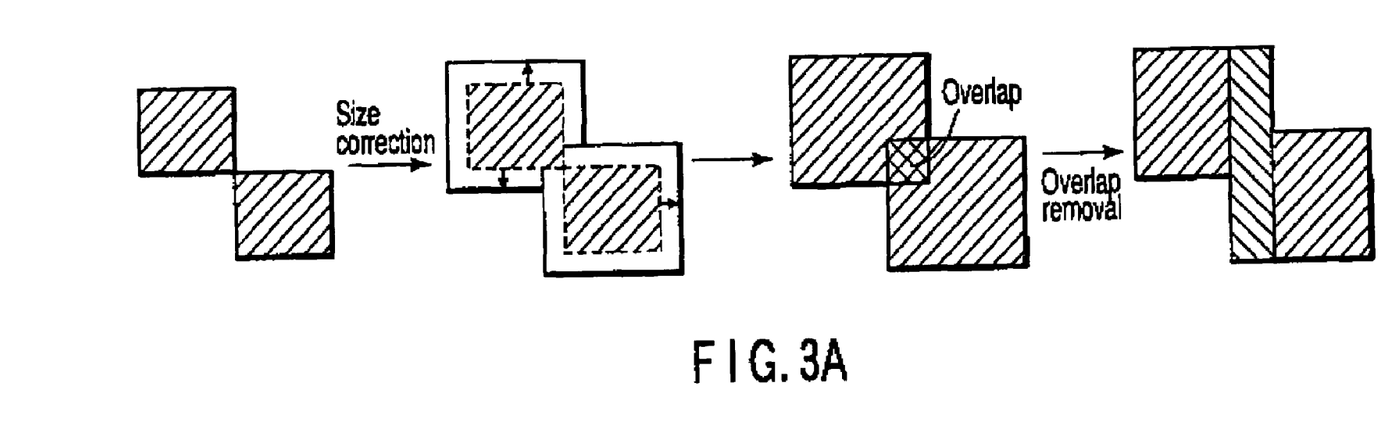
FIG. 3A and FIG. 3B are figures to explain the space, the overlap occurred after the size is corrected, and the removal method thereof.
Figure 3B:
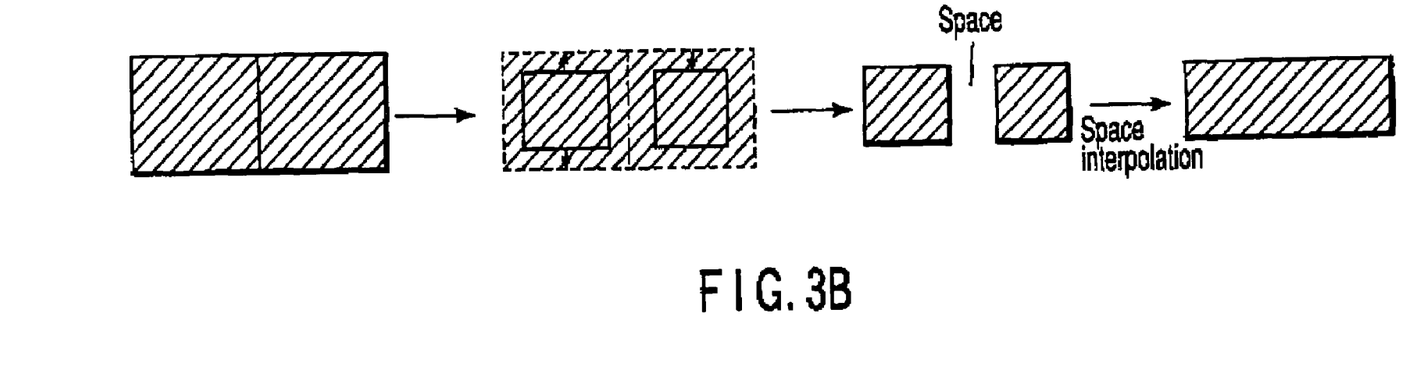

When the size is corrected in each small area, the overlap (a) or the space (b) of the figure with about 10 nm is caused in the area boundary as shown in FIGS. 3A and 3B. This influence may be appeared as an abnormal size. Whether it becomes an abnormal size or not depends on the characteristic of the resist, the process, and the beam resolution of the electron beam exposure device. For instance, when the beam resolution is far larger than this size of 10 nm and the contrast of the resist is not so large, since the influence of the overlap and the space hardly appears, the influence thereof can be ignored. On the other hand, in a case that the resolution is sufficiently low and the resist contrast is high, etc., the abnormal size is appeared. When this abnormality cannot be ignored, the processing in which the space appeared between the areas is buried, that is, the overlap removal may be performed by the CAD processing. The processing of such overlap removal etc. is a technique which has already been performed and can be achieved easily.

Hereinafter, embodiments of the present invention will be explained with reference to the drawings.

First Embodiment

In the first embodiment, the pattern density is used as an amount which characterizes the pattern for easiness.

Figure 4:
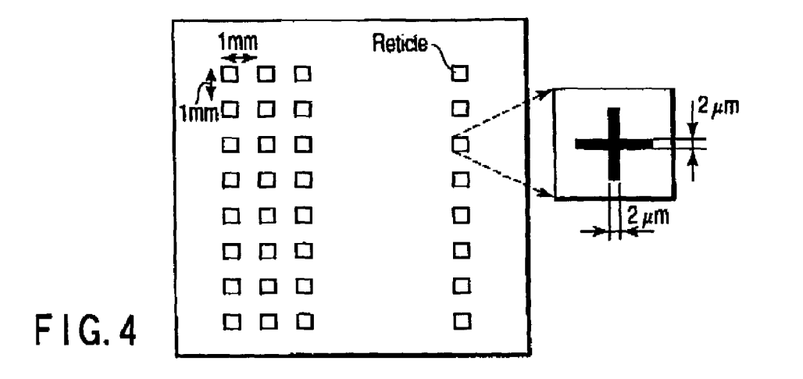
FIG. 4 is a figure which shows the pattern to check the position dependency of the wide range size change.

First, the pattern to measure the place dependency, the density dependency, and the range of the influence of the size change beforehand is drawn, and the size formed after processing of the process is measured. FIG. 4 is the pattern to check the pattern position dependency of the size on the mask. For measurement, the cross patterns of 2 μm in width are arranged for each 1 mm.

Figure 5:
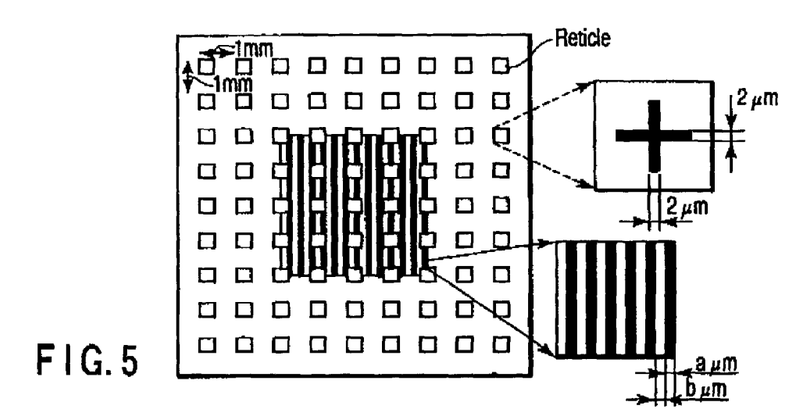
FIG. 5 is a figure which shows the pattern to check the pattern dependency of the wide range size change.

FIG. 5 is the pattern to check the pattern dependency. The cross pattern for measurement is arranged to the same position as that of FIG. 4. Additionally, the line & space pattern is arranged in the center part in the pattern shown in FIG. 5. The line & space is assumed to be a ratio of 1 mm:1 mm (50% in the density) in FIG. 5. On the other hand, since the pattern of FIG. 4 may be considered to be 0% in the density, the masks are made from both patterns as follows.

And, when the masks are compared, information of the density dependency can be taken.

First of all, drawing, development, and etching are performed using the pattern of FIG. 4 and FIG. 5. The size of each cross pattern is thereafter measured. The mask position dependency and the pattern dependency as mentioned above can be obtained from a result obtained by this operation. For instance, the size error in each place obtained by measuring the mask manufactured from the pattern of FIG. 4 (difference between the design value and the measurement value) is assumed to be fp(x, y). Here, (x, y) shows the position on the mask. This data fp(x, y) is a characteristic of "Size change which depends on the place" caused in the above-mentioned process. On the other hand, the size error in each place obtained by measuring the mask manufactured from the pattern of FIG. 5 is assumed to be fd(x, y).

The difference of both of them:

$$\text{diff}(x, y) = fd(x, y) - fp(x, y) \quad (2)$$

is the size error caused by the dependence on the pattern density and shows the place dependency. The size change characteristic by the pattern dependence is obtained based on this data as follows.

This diff(x, y) is considered to be a result of the convolution of the density in each place for easiness. The function g(x, y) which becomes the kernel of the convolution is approximated by the double Gaussian.

$$G(x, y) = \theta \times \exp(-x^2/\sigma^2 - y^2/\sigma^2) \quad (3)$$

That is, it is considered that the following pattern of:

$$\text{diff}(x, y) = \int g(x-x', y-y')p(x', y')dx \, 'Dy' \quad (4)$$

Here, the integration area is the pattern part (beam irradiation part at the mask drawing). p(x, y) is the pattern density at place (x, y). This function g shows "Size change characteristic by the pattern dependence" in the above-mentioned mask manufacturing process.

The function g can be obtained as follows. The function diff(x, y) is defined as:

$$\text{diff2}(x, y) = \int g(x-x', y-y')p(x', y')dx \, 'Dy' \quad (5)$$

The parameter θ and σ of g to which the difference between diff(x, y) and diff2(x, y) becomes smallest may be determined.

For instance, while changing the value of θ and σ, $$\int \{\text{diff}(x, y) - \text{diff2}(x, y)\}^2 dx, dy \quad (6)$$

is obtained with the computer, and θ and the σ when the value becomes smallest may be chosen.

Actually, the above-mentioned two-dimensional integration need not be strictly performed. The mask is divided into the smaller areas than the standard of the wide range size change, and the contribution of the each area may be added. For instance, it is sufficient that the small area is set to be 0.5 mm×0.5 mm, when the standard of the size change is 2 cm. The two-dimensional integration of above-mentioned (5) type can be substituted by the following addition, when the center coordinates of each small area and the pattern density are assumed to be (xi, yi) and p(xi, yi) (1.0 from 0.0), respectively.

$$\text{diff2}(xi, yi) = \Sigma g(xi-xj, yi-yj)p(xj, yj)dS \quad (7)$$

Here, dS is the area of the small area, i.e., 0.5 mm×0.5 mm. Moreover, the sum may be taken for the small area which exists in the area which is larger enough than the size change (in circle of 6 cm in the radius, for instance). It is assumed that double integration which appears by the following discussions is also executed by the addition with the unit of the small area, when the special description is not performed.

The size error in each place of the arbitrary pattern can be calculated by the above-mentioned (5) equation by using the function g(x, y) which indicates "Characteristic of the pattern dependence of the wide range size change" in the process obtained thus. The integration may be calculated by summing the densities p in each small area for putting the weights of g thereto as well as the above-mentioned method.

Figure 6:
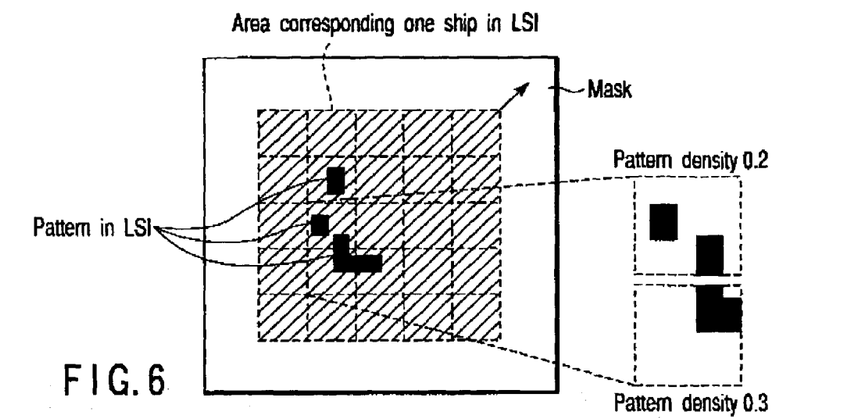
FIG. 6 is a figure to explain the method of calculating the area density of the pattern of each small area.
Figure 7:
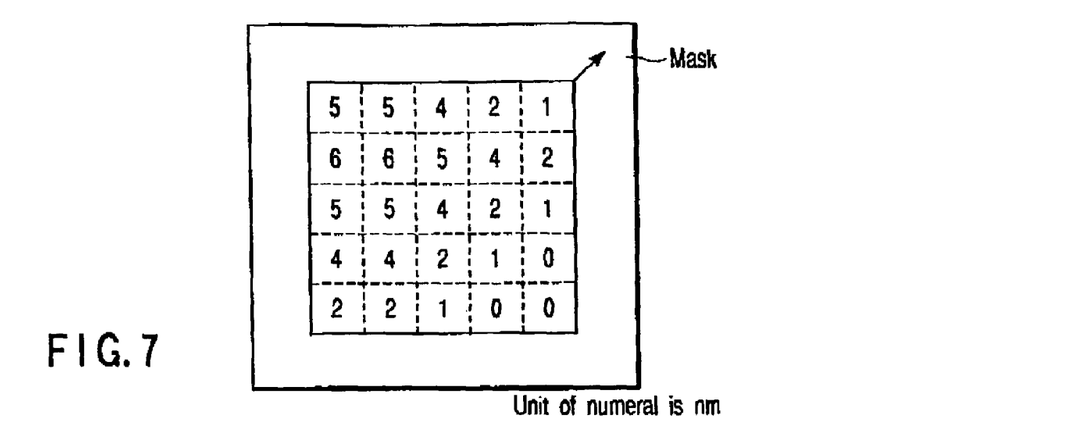
FIG. 7 is a figure to explain the method of correcting the size change caused by the place dependence.
Figure 8:
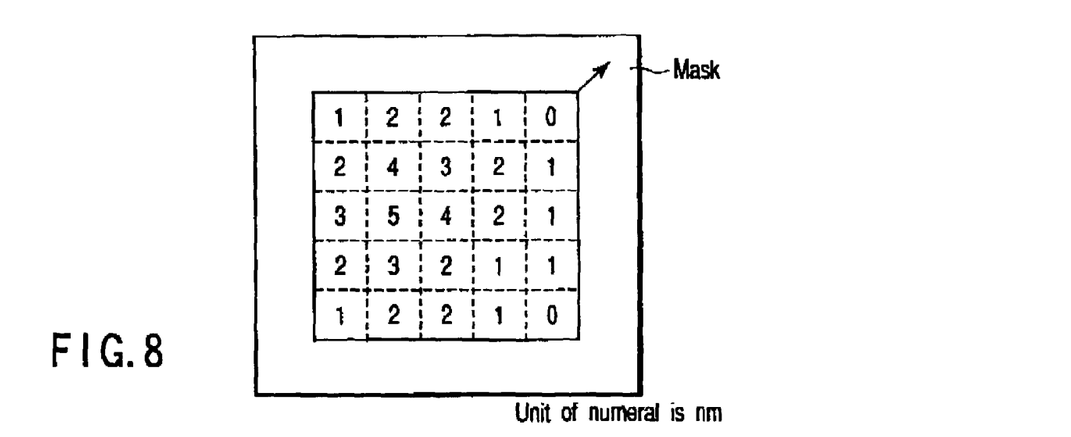
FIG. 8 is a figure to explain the method of correcting the size change caused by the pattern dependence.
Figure 9:
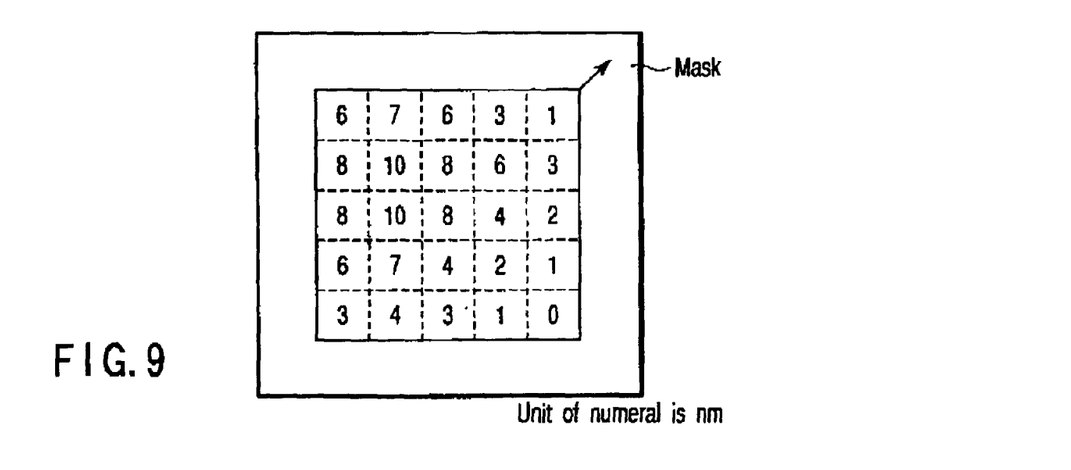
FIG. 9 is a figure to explain the method of correcting the size change (sum total of the position dependence part and the pattern dependence part)

Next, the procedure which actually corrects the LSI pattern will be explained by using the above-mentioned result referring to FIG. 6 to FIG. 9. FIG. 6 is a figure to explain the method of calculating the pattern area density of each small area. FIG. 7 is a figure to explain the method of correcting the size change caused by the place dependence. FIG. 8 is a figure to explain the method of correcting the size change by the pattern dependence. FIG. 9 is a figure to explain the method of correcting the size change (sum total of the position dependence part and the pattern dependence part).

First of all, the mask where the LSI pattern to be manufactured is arranged will be considered. The mask is divided into the sufficient smaller areas than the standard of the above-mentioned change distance (assumed to be 1 cm, for easiness here). Here, the size is assumed to be 500 μm×500 μm.

Next, the area of the LSI pattern which exists inside of each small area is calculated, and the calculated area is assumed the p(x, y). The reduction amount {Δ(x, y)} of the pattern in each small area is obtained as follows.

$$\Delta(x, y) = -fd(x, y) - \int g(x-x', y-y')p(x', y')dx'dy' \quad (8)$$

First item is a correction item of the size change which depends only on the place but not depend on the density as described above. The second item is the correction item of the size which changes by the pattern density dependence.

The time required to perform the above-mentioned calculation is sufficiently short and does not become a problem. To obtain the area density of each small area, it is sufficient that several ten minutes to several hours is required in the current EWS (engineering work-station) of about 200 MHz. The above-mentioned convolution calculation which uses the calculation result of the area density is farther shorter than this. The reason is as follows. Since the size of a small area is 0.5 mm×0.5 mm, there are only 200×200 areas, if the mask size is assumed to be 10 cm×10 cm. Therefore, processing amount is little. As a result, this convolution calculation is finished at the time of one second or less.

The processing by which the pattern is transformed based on the reduction rate of each area obtained thus is performed as follows.

(a) First of all, LSI pattern is decomposed corresponding to the above-mentioned small area.

(b) The pattern is reduced by the corresponding the reduction amount for each small area.

(c) Next, after synthesizing the pattern in which the above-mentioned processing is finished, (d) The gap between the patterns is buried.

Here, (a) is cutout processing of the pattern, and it is possible to achieve the processing easily. The method of (b) and (c) are same as the processing performed by the usual CAD processing and, for instance, the method known as the scan-line method can be used. The burial of the gap of (d) is a processing performed with the CAD system.

The size of the gap is only about twice the maximum value of the wide range size change at the first embodiment.

That is, the size of the gap is about 20×2 nm at most. On the other hand, the size of the space in the mask design is about 500 to 300 nm. That is, the space occurred by the above-mentioned procedure is a size which will not be generated in a general design. Therefore, such a space is specified, and the processing which buries it can be performed easily.

Figure 10A:
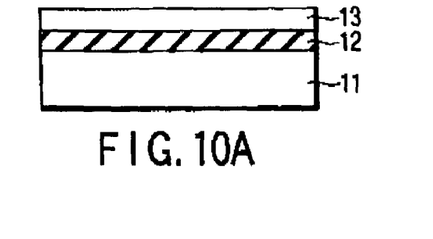
FIG. 10A to FIG. 10E are sectional views which show an example of the mask manufacturing process in the first embodiment.
Figure 10B:
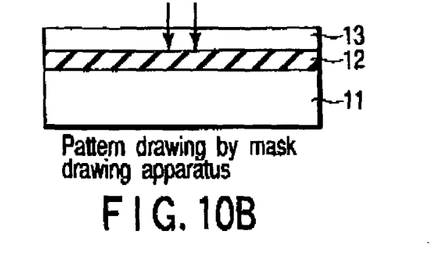

The outline of the mask manufacturing process where the manufacture pattern data is used is shown in FIG. 10A to FIG. 10E. The sample where the COG film 12 is formed on the mask substrate 11 and the resist 13 is coated thereon as shown in FIG. 10A is prepared. The data for the mask drawing device is created from the pattern in which the wide range size is corrected as previously explained. And, the pattern is drawn to the resist 13 by using this data with the mask drawing device (FIG. 10B). Here, as the mask drawing device used here, the same device which takes the basic data such as the place dependency of the size change etc. first is used. Or, the drawing device with similar machine characteristic is used as the mask drawing device. At this time, when the electron beam exposure device is used as the mask drawing device, the necessary corrections like the proximity effect correction etc. are added.

Figure 10C:
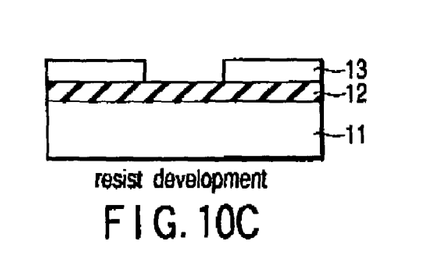

After drawing the pattern, the pattern of the resist 13 is formed by development (FIG. 10C). In the obtained resist 13 on the mask at this stage, the wide range size change occurred with the peculiar problem of the electron beam exposure device is almost corrected.

Figure 10D:
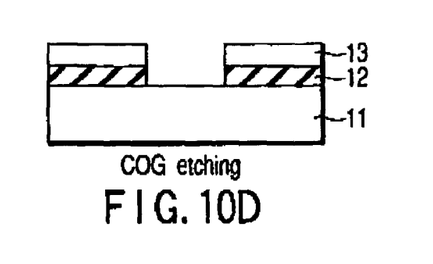
Figure 10E:
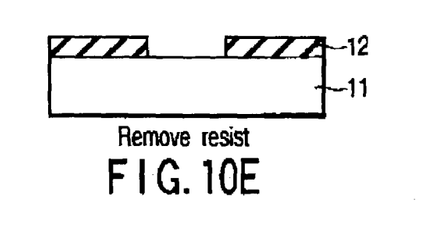
Figure 11A:
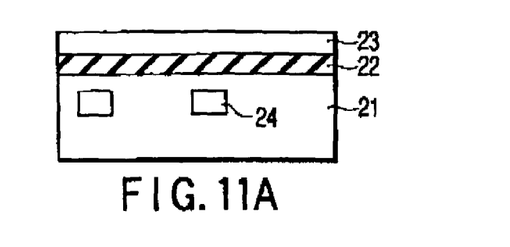
FIG. 11A to FIG. 11G are sectional views which show an example of the LSI manufacturing process in the second embodiment.
Figure 11B:
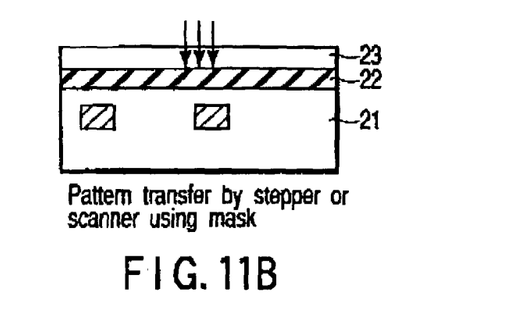
Figure 11C:
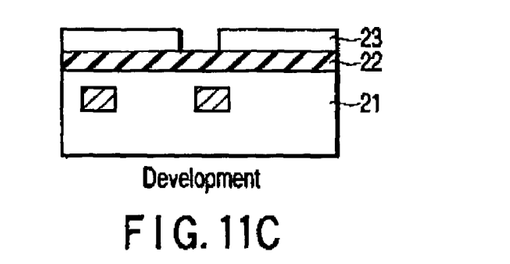
Figure 11D:
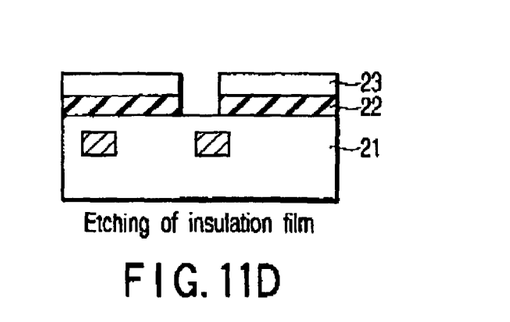
Figure 11E:
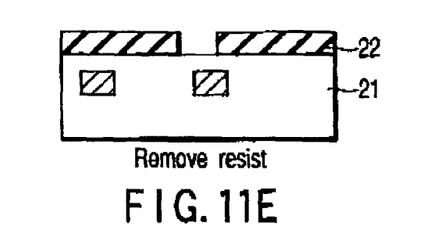
Figure 11F:
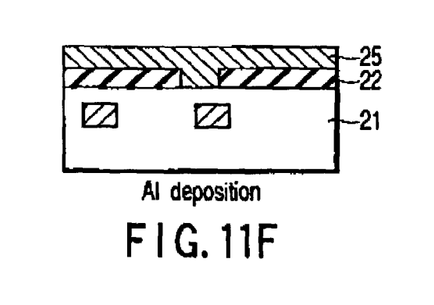
Figure 11G:
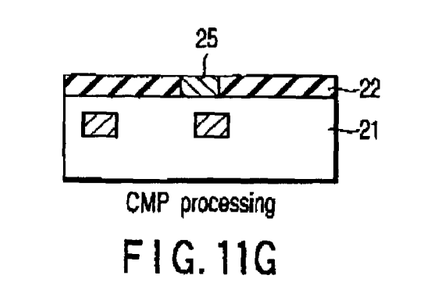
Figure 12A:
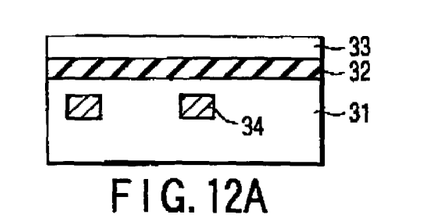
FIG. 12A to FIG. 12E are sectional views which show an example of the LSI manufacturing process in the modification of the present invention.
Figure 12B:
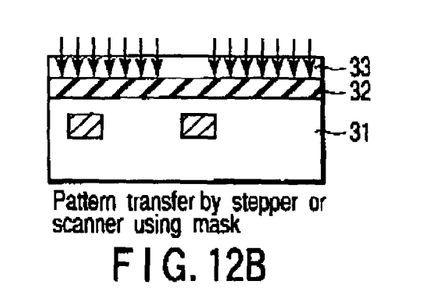
Figure 12C:
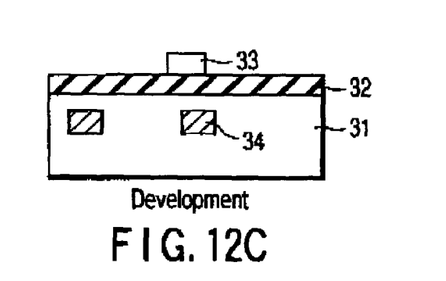
Figure 12D:
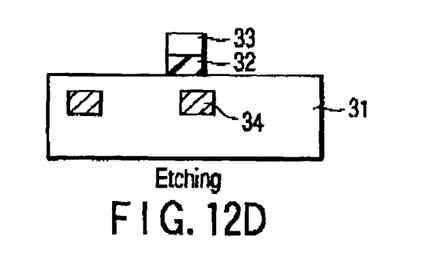
Figure 12E:
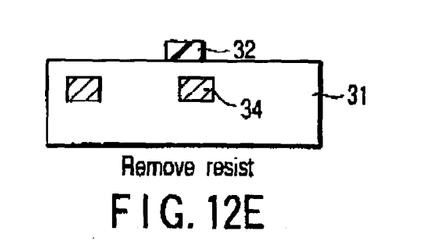

Next, the resist 13 is used as a mask, the COG film 12 is selective-etched with the RIE etc. (FIG. 10D). As the method of etching and the device at this time, the etching device which have taken the basic data is also still used. Or, the device whose characteristic is almost the same is used as the etching device. Thereafter, the resist 13 is removed (FIG. 10E).

Since the mask of the manufacture according to the above-mentioned procedure becomes the mask to which the various corrections are automatically performed, the mask with high accuracy can be obtained.

According to the first embodiment as mentioned above, the wide range size error which occurs in each device and each process used in the manufacture of the mask, and the wide range size error which occurs through all processes are separated to the contribution only according to the position and the contribution according to the pattern. And, the design pattern size is corrected based on these correlations by a small area unit that the size change becomes within the permissible value. The desire pattern is formed to the mask based on this corrected pattern size. As a result, the wide range size change occurred overall when the mask is manufactured can be corrected with good accuracy. Therefore, the mask with higher accurate can be manufactured.

Second Embodiment

FIG. 11A to FIG. 11G are figures which show the outline of the LSI manufacturing process to which the present invention is applied. A wafer 21 as the ground substrate, an insulation film 22, a resist 23, a ground pattern 24, and an Al film 25 are shown in FIG. 11A to FIG. 11G. The second embodiment has a feature in the manufacture of the mask used to form the wiring pattern, though the processes shown in FIG. 11A to FIG. 11G are well-known for the buried wiring formation.

The process characteristic of some processes used in the LSI manufacturing process is first measured, and the LSI is divided into the position dependence part in the pattern dependence part. This is started from the stage where the mask is manufactured by using the pattern of FIG. 4 and FIG. 5 as well as the first embodiment. The electron beam exposure device is used as the drawing device. Since the size measurement at the stage of the resist has a large error in the present measurement technology, the measurement is performed after the etching of chrome, and the characteristic of the mask manufacture process is evaluated.

The size of each place is measured after the pattern of FIG. 4 and FIG. 5 is drawn, developed, and etched, and, as a result, R1(x, y) and r1(x, y) are obtained. By using these, by dividing into the place dependence part and the pattern dependence part from two kinds of data, and function p1(x, y) and the one point function g1(x, y) are obtained for each part as well as the first embodiment.

Next, the mask manufactured by the above-mentioned process is used. The size of the pattern formed on the insulation film is measured after the pattern is transferred on the wafer by using the stepper, developed with the development device, and etched with a dry etching device. The wide range size change of the pattern of FIG. 2A to FIG. 2C occurred in this process is as follows, if the result obtained for each pattern is assumed to be R2(x, y) and r2(x, y). First of all, as the position dependence part $$\Delta R2\_1(x, y)=R2(x, y)-R1(x, y) \qquad (9)$$

is obtained and as the pattern dependence part $$\Delta r2\_1(x, y)=r2(x, y)-r1(x, y) \qquad (10)$$

is obtained.

$\Delta R2\_1$ is obtained as the position dependence part in this process, and $\Delta r2\_1-\Delta R2\_1$ is obtained as the pattern dependence part from above-mentioned $\Delta R2\_1$ and $\Delta r2\_1$. The function g2(x, y) of the kernel of the pattern dependence item in this process can be obtained from $\Delta R2\_1$ and $\Delta r2\_1$ as well as the first embodiment. In addition, if the similar process, the measurement, and the analysis are performed only about the CMP process, the position dependence characteristic and the place dependence characteristic of the CMP process can be obtained.

In a case that the process characteristic is obtained by the above-mentioned processing, the processing afterwards becomes almost the same as the first embodiment. First of all, the size whose size change distance is the shortest in all process characteristic is chosen (for instance, 1 cm) and the smaller size than it is chosen the small area (for instance, 0.5 mm×0.5 mm).

Next, the correction amount in each small area is calculated on the computer as follows. First of all, the density p(x, y) of the pattern which exists in each small area on the mask is calculated as well as the first embodiment. The correction amount of the size in each small area can be calculated so that the position dependence part is $$p1(x, y)-p2(x, y)-p3(x, y) \qquad (11)$$

and the pattern dependence part is $$\int \{g1(x-x', y-y')+g2(x-x', y-y')+ \\ g3(x-x', y-y')\} \times \rho(x', y') \qquad (12)$$

Here, p1, p2 and p3 are the position dependence functions of mask manufacture process, the stepper transfer and etching process and the CMP process, respectively. Moreover, g1(x-x', y-y')+g2(x-x', y-y')+g3(x-x', y-y') is the kernel of each pattern dependence function.

The size is corrected according to the correction amount obtained like this. The pattern data is obtained by performing the overlap removal between figures or the space burial if necessary as well as the first embodiment. The mask is manufactured by using each device used to evaluate the above-mentioned characteristic based on this data. And, by performing the formation process of the buried wiring by using this mask according to the procedure shown in FIG. 11A to FIG. 11G, the degradation of the wide range size occurred in each process is automatically corrected. As a result, the LSI pattern with high accuracy can be obtained.

There might be two or more kinds of devices used in each process. There are several CMP devices, and for instance, one device is properly selected and is used occasionally. The above-mentioned procedure may be used as it is, if there is no significant difference in the characteristic between the CMP devices. Oppositely, the characteristic function of the process (CMP process) in a case of using it is obtained first for each CMP device when there is a significant difference. And, the above-mentioned procedure may be performed by using the characteristic function of, for instance, g3 in a case of using the device, if the device is used.

Modification

In the second embodiment, the application method to the LSI manufacturing method called a damacine is explained, but the present invention is not limited to this. FIG. 12A to FIG. 12E are the manufacturing process different from the damacine which does not perform the CMP. The wafer 31, the Al film 32, the resist 33, and the pattern 34 as the ground substrate are shown in FIG. 12A to FIG. 12E. The present invention can be also applied by correcting a part of the second embodiment in this case.

For instance, in the second embodiment, it is considered that there are two kinds of macro processes of (the mask manufacturing process) and (from transfer by the stepper to the dry etching). For instance, it is considered that the aluminum pattern is processed directly by the dry etching. The application of the present invention is straightly. The size change characteristic is divided into the position dependence part and the pattern dependence part and is obtained for each macro process. The pattern is corrected based on the obtained size change characteristic for the size correction amount in each place. And, the mask is made by using this to manufacture the LSI.

in addition, in the second embodiment and the above-mentioned modification, the processing of the pattern for one layer is divided into the several processes, the characteristic of each process is checked and the size is corrected as the sum of the characteristic. However, the correction may be performed by checking the characteristics throughout all processes. That is, the following method may be applied to. Two masks are made by using the patterns of FIG. 4 and FIG. 5. After the CMP process is finished, the pattern formed on the wafer is measured. The position dependence characteristic and the pattern dependence characteristic of the size are obtained at the sate time. Various patterns are corrected by using this characteristic data.

The present invention can be used without depending on the concrete procedure of the LSI manufacturing process and the mask manufacturing process and the detail thereof.

In the first and second embodiments, the kernel of the density dependence function is assumed to be a single Gaussian for easiness. However, the kernel of the density dependence may be the sum of two or more Gaussian, other functions may be used except for Gaussian, and the sum of such functions may be used. In the above embodiments, etc., it is assumed that the σ value of Gaussian in the x direction and that in the y direction is the same, and is explained in the isotropic environment. However, when the isotropy collapses caused by the device characteristic etc., the non-isotropy can be reflected by changing the σ value of the x direction and the y direction.

The method according to the embodiment of the present invention can be used together with the local size correction to correct an optical proximity effect. The above-mentioned procedure may be taken by using pattern (A) which corrects the optical proximity effect and the size error which appears in an illumination different size beforehand. When the reticle is manufactured, the pattern of A is faithfully reproduced on the mask. Moreover, the pattern on the reticle does not faithfully reproduce the pattern of A and the size thereof is different according to the place, when applying to the LSI manufacturing process. Finally, the change corrects the error such as steppers afterwards, and the target size will be obtained on the wafer In addition, the drawing device which uses an optical beam may be used, though the electron beam exposure device may be used as the mask drawing device in each above-mentioned embodiment.

As described above, the position dependency and the pattern dependency is related to the shift from the design value of the size on the LSI (or, on the mask) after passing the mask manufacture process and LSI manufacture process. In addition, as described above, they are independent to each other.

That is, the method according to an embodiment of the present invention may be applied regardless of the details of the device used therein. The details of the use device are absorbed to the information of "Position dependency and pattern dependency of the size change" characterized about all processes or the process using the device.

In the above-mentioned embodiment, it is argued that the situation that the only 1 chip data of the LSI is drawn in on the single mask is considered, but the present invention can be applied even in a case that a plurality of chips are drawn on the single mask. In a case of the mask manufacturing, the size change of the position dependence is corrected based on the position on the mask, and this may be combined with the correction of the pattern dependence. In a case of the LSI manufacturing, two or more chips on the mask are grouped and this is considered to be a chip virtual. Then, the size change of the position dependence in it is corrected and this may be combine with the correction of the pattern dependence.

Figure 13:
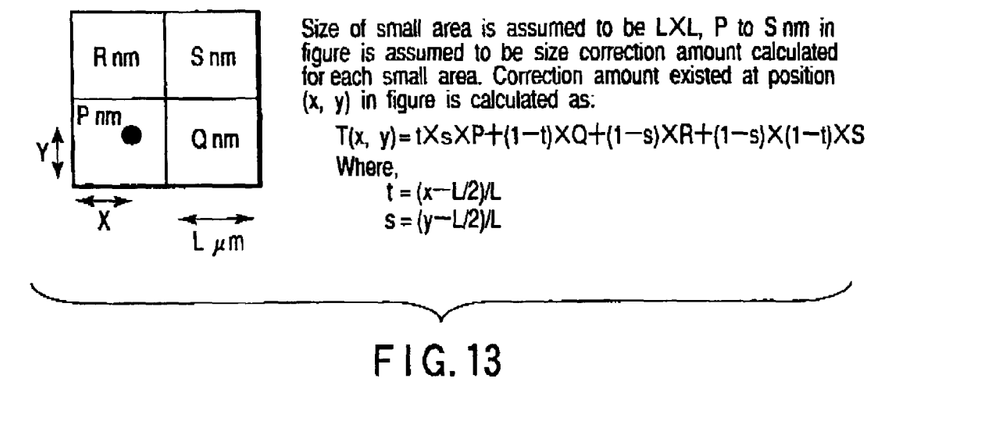
FIG. 13 is a figure to explain an example which changes amount of size correction by depending on the position in the small area.

In addition, in the above-mentioned embodiment, though the size of a pattern inside in each small area is uniformly corrected by the correction value calculated about the small area, the size correction amount may be changed according to the position in the area as shown in FIG. 13. As a result, though it is nm order (or less), it can be suppressed that the size changes rapidly between each small area.

In addition, though the position characteristic and the pattern characteristic are processed independently in the above-mentioned embodiment, the present invention can be applied when the independency of the correlation is slightly fallen down in one device for some reasons. For this case, the interaction of the above-mentioned characteristic of the position and the pattern characteristic may be included. For instance, it is possible to deal by the place dependency is added to convolution function g and adding the position dependency to θ for instance.

In addition, though the density is used as an amount of the feature of the pattern dependency of the size in the above-mentioned embodiment, the center of the gravity and the area of the pattern in a small area may be the amount of the feature to be used by the proximity effect correction. Moreover, it is processed by weighting to the pattern size which exists in a small area and the result thereof may be the amount of the feature. For instance, the weight is assumed to be 0.0 in the size of area 1 μm² or less, the weight is assumed to be 0.5 in that from 1 μm² to 10 μm², the weight is assumed to be 1.0 when the area is larger than that, and the weighted result is accumulated, then the result thereof may be the amount of the feature.

Though the correction amount of the size is assumed to be the sum of the correction amount of the position dependence and the correction amount of the density dependence in the above-mentioned embodiment, the present invention is not limited to this. For instance, to perform correction with higher accuracy or when the correlation of the position dependence and the density dependence cannot be ignored, the following means may be applied to correct it.

when the size correction amount in the place (x, y) is assumed to be $\Delta L(x, y)$ and the size errors of the position dependence and the density dependence are assumed to be $\Delta f(x, y)$ and the $\Delta g(x, y)$, respectively, $$\Delta L(x, y)=1-\{1+\Delta f(x, y)\}\times\{1+\Delta g(x, y)\}$$

may be acceptable, or the parameters a, b and c may be optimized by the used processes or devices as assumed to be $$\Delta L(x, y)=a\Delta f(x, y)+b\Delta g(x, y)+c\Delta f(x, y)\Delta g(x, y)$$

Furthermore, the change of the density of the original pattern can be fed back to the correction amount by correcting the size as follows. That is, as described in the above-mentioned embodiment, after correcting the size tor each 0.5 mm×0.5 mm and burying the overlap removal and the space, the pattern density is obtained again and the size correction amount in each area is obtained. The correction is ended assuming that enough correction accuracy is obtained if the size correction amount is below a fixed value (for instance, 1 nm) in all the areas. Oppositely, if there is an area which becomes more than the desired value, the processing of the size correction, the overlap removal, etc. is advanced, and the above-mentioned procedure is repeated.

In short, the present invention can be executed by modifying the invention within the scope of the invention.

According to the present invention, by checking a wide range size change characteristic for each device in a case of using a device group used for forming a pattern, correcting a design pattern size for smaller each area than a standard distance to which a predetermined size change is caused by using data of the each correlation, when the mask is manufactured by using the device group, and forming a desired pattern on the mask based on the corrected information, it becomes possible to correct the wide range size change occurred in the mask and the wafer and in addition, the correction accuracy can be dramatically improved compared with the conventional method.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A pattern forming method comprising:
    checking a wide range size change characteristic for each device in a case of using a device group used for forming a pattern;
    dividing a design pattern size into small areas each of which is smaller than a standard distance to which a predetermined size change is caused, when the pattern is formed on a sample by using the, device group;
    acquiring correction information of the size of the pattern of each of the small areas by using the wide range size change characteristic; and
    forming a desired pattern based on the acquired correction information, wherein, checking the wide range size change includes checking two correlations of a correlation between a position and a size change in a chip on a wafer or two or more chips and a correlation between a pattern characteristic and a size change.

2. The pattern forming method according to claim 1, wherein correction using the correction information is performed for each of the small areas.

3. The pattern forming method according to claim 1, wherein the predetermined size change is a size change in a wide range on the order of 1 cm order.

4. A manufacturing method of a mask comprising:
    checking a correlation of a position and a size change and a correlations of a pattern characteristic and a size change on the mask in a case of using a device group used for manufacturing the mask;
    correcting a design pattern size for small areas each of which is smaller than a standard distance to which a predetermined size change is caused by using data of each correlation, when the mask is manufactured by using the device group; and
    forming a desired pattern on the mask based on the corrected design pattern size, wherein, checking the size change includes checking two correlations of a correlation between a position and a size change in a chip on a wafer or two or more chips and a correlation between a pattern characteristic and a size change.

5. A manufacturing method of an LSI comprising:
    checking a correlation of a position and a size change and a correlation of a pattern characteristic and a size change in a chip on a wafer or a chip group in a case of using a device group used for a manufacturing process of the LSI;
    correcting a design pattern size for smaller areas each of which is smaller than a standard distance to which a predetermined size change is caused by using data of the each correlation, when the LSI is manufactured by using the device group;
    forming a desired pattern on a mask based on the corrected design pattern size; and
    manufacturing the LSI by using the mask on which the desired pattern is formed, wherein, checking the size change includes checking two correlations of a correlation between a position and a size change in a chip on a wafer or two or more chips and a correlation between a pattern characteristic and a size change.

6. A manufacturing method of a mask comprising:
    checking a correlation of a position and a size change and a correlations of a pattern characteristic and a size change on the mask in a case of using at least one of a plurality of devices used for manufacturing the mask;
    correcting a design pattern size for smaller areas each of which is smaller than a standard distance to which a predetermined size change is caused by using data of the each correlation, when the mask is manufactured by using the each of the plurality of devices device; and
    forming a desired pattern based on the corrected design pattern size, wherein, checking ihe size change includes checking two correlations of a correlation between a position and a size change in a chip on a wafer or two or more chips and a correlation between a panern characteristic and a size change.

7. A manufacturing method of an LSI comprising:

checking a first correlation of a position and a size change and a second correlation of a pattern characteristic and a size change in a chip on a wafer or a chip group in a case of using at least one of a plurality of devices used for a manufacturing process of the LSI;

correcting a design pattern size for smaller areas each of which is smaller than a standard distance to which a predetermined size change is caused by using data of the each of first and second correlations, when the LSI is manufactured by using the each of the plurality of devices;

forming a desired pattern on a mask based on the corrected design pattern size; and manufacturing the LSI by using the mask on which the desired pattern is formed, wherein, checking the size change includes checking two correlations of a correlation between a position and a size change in a chip on a wafer or two or more chips and a correlation between a pattern characteristic and a size change.

8. The manufacturing method of an LSI according to claim 7, wherein the checking the correlations includes performing work of obtaining the first and the second correlations at substantially all processes, and obtaining the first and the second correlations in all processes from the first and second correlations in each process.

* * * * *